United States Patent [19]

Preisler et al.

[11] Patent Number: 5,244,876
[45] Date of Patent: Sep. 14, 1993

[54] METHOD FOR JOINING PARTS OF CERAMIC HIGH-TEMPERATURE SUPERCONDUCTOR MATERIAL

[75] Inventors: Eberhard Preisler; Joachim Bock, both of Erftstadt; Johannes Holzem, Hürth; Werner Horst, Brühl, all of Fed. Rep. of Germany

[73] Assignee: Hoechst Aktiengesellschaft, Frankfurt am Main, Fed. Rep. of Germany

[21] Appl. No.: 966,589

[22] Filed: Oct. 26, 1992

Related U.S. Application Data

[63] Continuation of Ser. No. 648,135, Jan. 30, 1991, abandoned.

[30] Foreign Application Priority Data

Feb. 13, 1990 [DE] Fed. Rep. of Germany ....... 4004363

[51] Int. Cl.$^5$ .............................................. H01L 39/12
[52] U.S. Cl. .......................................... 505/1; 156/48;
156/89; 156/158; 505/739; 505/782; 264/261;
264/332
[58] Field of Search ............... 264/60, 261, 332;
156/89, 48, 158; 505/1, 725, 739, 782

[56] References Cited

U.S. PATENT DOCUMENTS

| | | | |
|---|---|---|---|
| 4,797,510 | 1/1989 | Mihelich | 505/1 |
| 5,004,722 | 4/1991 | Tallman | 505/1 |
| 5,051,397 | 9/1991 | Sato et al. | 505/1 |
| 5,053,384 | 10/1991 | Schwartzkopf | 505/1 |
| 5,079,226 | 1/1992 | Sakai et al. | 505/1 |
| 5,116,810 | 5/1992 | Joshi et al. | 505/1 |

FOREIGN PATENT DOCUMENTS

0347770 6/1989 European Pat. Off. .
3830092 3/1990 Fed. Rep. of Germany .

OTHER PUBLICATIONS

Japanese Abstract No. 01-183083., *Patent Abstracts of Japan* published Oct. 23, 1989.

*Primary Examiner*—Jan H. Silbaugh
*Assistant Examiner*—Christopher A. Fiorilla
*Attorney, Agent, or Firm*—Connolly & Hutz

[57] ABSTRACT

Method for joining parts of ceramic high-temperature superconductor material of the composition $Bi_{(2+a-b)}(Sr_{1-c}Ca_c)_{(3-a)}Pb_bCu_{(2+d)}O_x$, where a is 0 to 0.3, b is 0 to 0.5, c is 0.1 to 0.9 and d is 0 to 2 and x has a value depending on the state of oxidation of the metals present, the end faces of the parts located at a gap spacing apart from one another are heated by means of a fuel gas/oxygen flame to temperatures from 750° to 875° C. Simultaneously, a rod of the same material above the spacing gap is heated until the melt thereof drips off into the gap between the end faces of the two parts, completely filling the gap. At least the joint region between the two parts is then heat-treated for 7 to 100 hours at temperatures between 780° and 850° C.

6 Claims, 4 Drawing Sheets

METHOD FOR JOINING PARTS OF CERAMIC HIGH-TEMPERATURE SUPERCONDUCTOR MATERIAL

This application is a continuation of application Ser. No. 07/648,135 filed on Jan. 30, 1991, now abandoned.

The present invention relates to a method for joining parts of ceramic high-temperature superconductor material of the composition $Bi_{(2+a-b)}(Sr_{1-c}Ca_c)_{(3-a)}Pb_bCu_{(2+d)}O_x$, where a is 0 to 0.3, b is 0 to 0.5, c is 0.1 to 0.9, d is 0 to 2 and x has a value depending on the state of oxidation of the metals present.

German Patent Application P 3,830,092.3, which is not a prior publication, has disclosed a process for preparing a high-temperature superconductor of the composition $Bi_2(Sr,Ca)_3Cu_2O_x$ with x values from 8 to 10. In this case, stoichiometric mixtures of the oxides or carbonates of bismuth, strontium, calcium and copper are heated to temperatures from 870° to 1100° C. to form a homogeneous melt. The homogeneous melt is cast in molds and solidifies therein. The castings taken from the molds are heat-treated for 6 to 30 hours at 780° to 850° C. and then treated for a least 6 hours at 600° to 830° C. in an oxygen atmosphere. In this way, platelets of an edge length or diameter of up to several cm and rods of up to 50 cm length and 10 mm diameter can be produced, each of which consist of a pure phase of the compound.

A disadvantage here is that the ceramic high-temperature superconductor described above is so brittle that it cannot be rolled up for transport in the form of long current conductors onto a drum of large diameter (for example 2 m) without breaking or suffering cracks, particularly if the high-temperature superconductor is to be used for heavy current transmission.

Ceramic high-temperature superconductors in powder form have also already been filled into silver tubes and the tubes have been elongated by swaging and deep-drawing until "wires" of the desired diameter were obtained, the high-temperature superconductor powder present in the interior of the silver tubes being sinterable by heat treatment to give a coherent core. In this case, the oxygen required for forming the superconductor diffuses through the wall of the silver tubes.

The said "powder in tube" conductors withstand a certain degree of bending, so that in principle they can be used as current transmission conductors. A disadvantage thereof is, however, that they can be bent without destruction only at a small diameter and cannot be interconnected into complicated systems.

It is therefore the object of the present invention to indicate a method for joining parts of ceramic high-temperature superconductor material to give complicated and extended structures, in which the junctions are also superconducting. This is achieved according to the invention by heating the end faces of the parts located at a gap spacing apart from one another and not being surrounded by a sleeve by means of a fuel gas/oxygen flame to temperatures from 750° to 875° C. and simultaneously heating a rod of the same material above the spacing gap until the melt thereof drips off into the gap between the end faces of the two parts, completely filling the gap, and then heat-treating at least the joint region between the two parts for 7 to 100 hours at temperatures between 780° and 850° C.

If desired, the process according to the invention can also be further developed by a) heat-treating at temperatures from 815° to 830° C.,
b) the heat treatment time depending on the thickness of the junction, a thicker junction requiring a longer heat treatment time and vice versa,
c) the end faces of the parts to be joined being in a mutually parallel arrangement,
d) the end faces of the parts to be joined being in a wedge-shaped mutual arrangement, and
e) the ceramic high-temperature conductor material parts to be joined being each sheathed by a silver tube.

The compounds used according to the invention, for example $Bi_2(Sr,Ca)_3Cu_2O_x$ (with x of about 8.2) melt incongruently, i.e. they do not have a melting point, but a melting interval. Moreover the surface tension of this melt towards the solid phase in air is s high that the melt does not immediately run off from the solid phase.

These two properties are good prerequisites for a behavior which is similar to the joining of metals by autogenous welding.

The melting of the compound $Bi_2(Sr,Ca)_3Cu_2O_x$ (with x of about 8.2) takes place, for example, above 875° C. with loss of oxygen, the melting temperature dropping to about 780° C. at x of about 7.5. The solid present after the solidification of this melt is no longer superconducting, but it can be converted again into the superconducting state by heat treatment at about 800° C. in air.

In the method according to the invention, care must be taken to ensure that the end faces of the parts to be joined together are so hot that they can bond to the melt dripping off from the heated rod.

In the method according to the invention, a thin junction is heat-treated for 8 to 15 hours, whereas a thicker junction is heat-treated for up to 100 hours.

The heat treatment of the junction between the parts can be effected by subjecting the complete newly created shaped part to the heat treatment in an oven. However, the heat treatment can also be carried out locally by arranging an electric miniature oven with precise temperature measurement and control around the junction, or by local high-frequency induction heating or by direct heating using electrodes arranged transversely to the junction, or by laser pulses.

In the welding according to the invention of shaped parts of high-temperature superconducting ceramic material, sheathed with a silver tube, particular care must be taken to ensure that the fuel gas/oxygen flame does not come into contact with the silver sheath and melts the latter, since the melting points of silver and of the high-temperature superconducting compound are not far apart. The silver-free joint region between the two parts joined according to the invention can be, if desired, sheathed with silver afterwards.

Applications of the method according to the invention are illustrated diagrammatically and in cross-section in the attached drawing, in which.

Figure 1A:
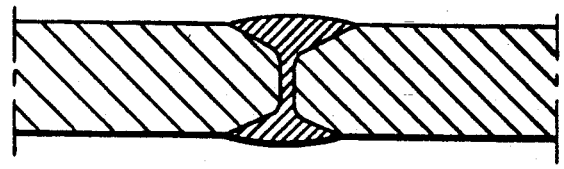
FIG. 1A shows the joining of two round rods with end faces arranged mutually parallel, FIG. 1B shown the joint of two round rods after heat treatment.
Figure 1B:
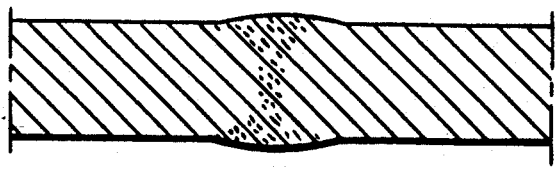
Figure 1B:

In FIGS. 1A and 1B the hatching symbol block A represents the solidified non-superconducting melt, and the hatching symbol block B represents the superconducting compound after further heat treatment.

FIG. 1A shows the joint of the round rods immediately after solidification of the melt which has dripped into the gap, while FIG. 1B shows the junction after heat treatment for 24 hours at 815° C.

Figure 3:
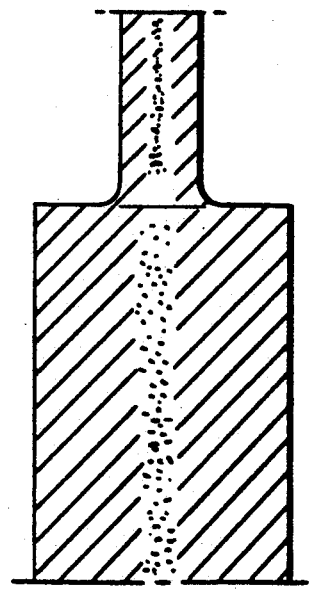
FIG. 3 shows the joining of a thicker round rod and a thinner round rod, with the end faces in a mutually parallel arrangement.

In FIG. 3, there are cavity regions in the longitudinal axis of the thicker and the thinner round rod.

Figure 5:
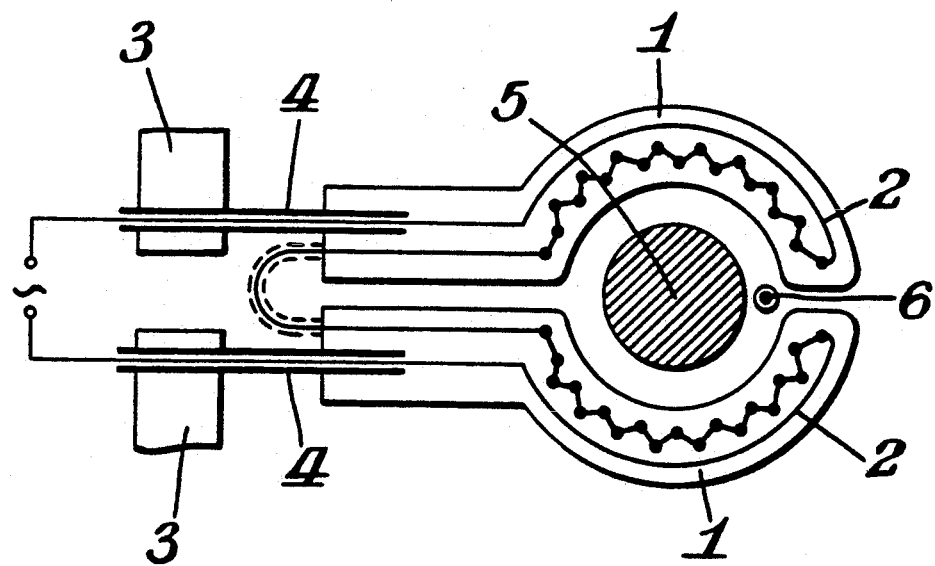
FIG. 5 shows a device for the local heat treatment of joints of round rods.

In FIG. 5, there is a ceramic heat carrier 1, which contains resistance-heating coils 2, is fixed via tube passages 4 in holders 3. 5 represents the joint seam of two round rods of ceramic high-temperature superconductor material. A thermocouple 6 is located close to the joint seam 5.

Figure 6:
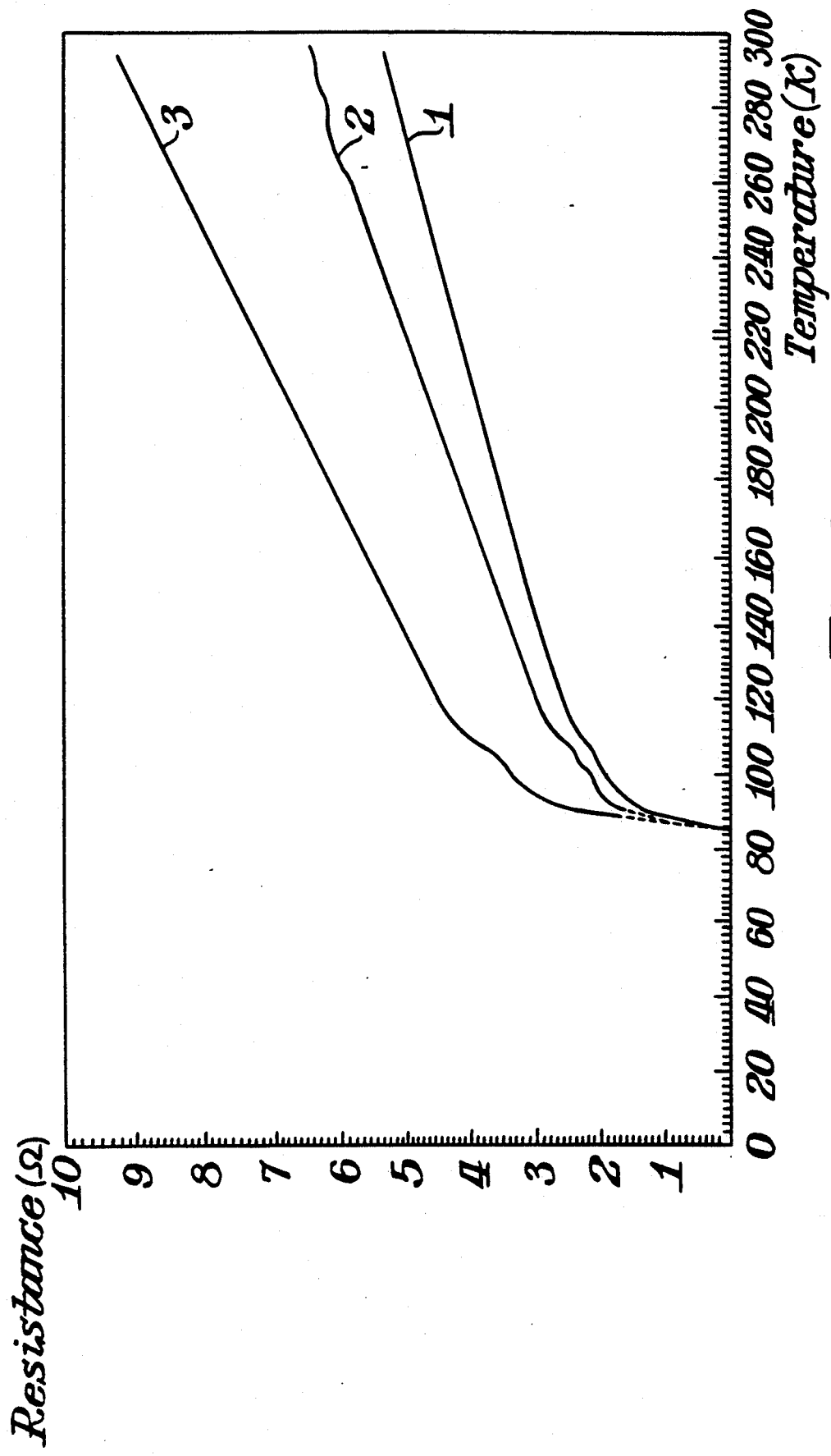
FIG. 6 shows temperature/resistance diagrams.

In FIG. 6, three measurements on the parts joined according to the invention by the procedure of Example 1 are represented; in detail, curves 1 and 2 show the measurements on each of the joined parts and curve 3 shows the measurement in the joint region of the two parts beyond the weld.

EXAMPLE 1

Two round rods of 5 mm diameter and 150 mm length, prepared by the process according to German Patent Application P 3,830,092.3, were pushed together on a ceramic substrate, leaving a gap, until their end faces were mutually parallel. The end faces were heated to bright-red heat by means of a natural gas/oxygen flame. Simultaneously, a round rod of the same material above the gap was heated to such a degree that melt dripped off into the gap. The gap was uniformly filled with melt by slowly rotating the two round rods (cf. FIG. 1A). After heat treatment of the joined round rods for 12 hours at 815° C. in an oven, the joint zone between the two round rods was superconducting (cf. FIG. 1B).

The transition temperature of the joint zone of the two round rods was 85.5K; to the right and left thereof, transition temperatures of 86.0 and 86.5K respectively were measured (cf. FIG. 6).

EXAMPLE 2

Figure 2A:
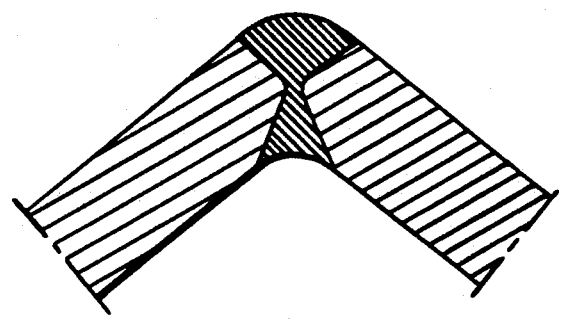
FIG. 2A shows the joining of two thicker round rods with the end faces in a wedge-shaped mutual arrangement.
Figure 2B:
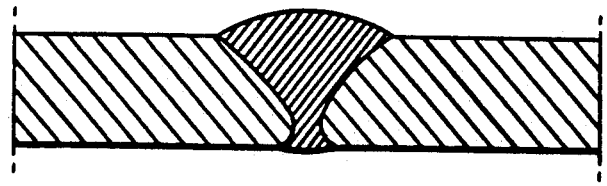
FIG. 2B shows the two thicker round rods with end faces arranged mutually parallel.

Two round rods of 12 mm diameter and 300 mm length, prepared by the process according to German Patent Application P 3,830,092.3, were placed with their end faces in a wedge-shaped mutual arrangement. By means of a propane gas/oxygen flame, the open wedge was heated and incipiently melted from the base, before melt from a dripping round rod of the same material dripped from above into the wedge and filled it completely (cf. FIG. 2A). The joined round rods were then heat-treated in an oven for 24 hours at 800° C.

In order to check whether the joint zone between the two round rods was now superconducting, the specific resistance of the joined round rods was measured.

At 293K before heat treatment: $1 \Omega \times cm$
At 293K after heat treatment : $0.001 \Omega \times cm$
At 77K after heat treatment : $0 \Omega \times cm$

EXAMPLE 3

Example 2 was repeated with the modification that a round rod of 5 mm diameter and 120 mm length and a round rod of 16 mm diameter and 40 mm length were clamped into a holding device in such a way that their axes were centered and their end faces were arranged mutually parallel (cf. FIG. 3).

The measurement of the specific resistance of the joined round rods gave:

At 293K before heat treatment: $2.8 \Omega \times cm$
At 293K after heat treatment : $0.0015 \Omega \times cm$
At 77K after heat treatment : $0 \Omega \times cm$

EXAMPLE 4

Figure 4:
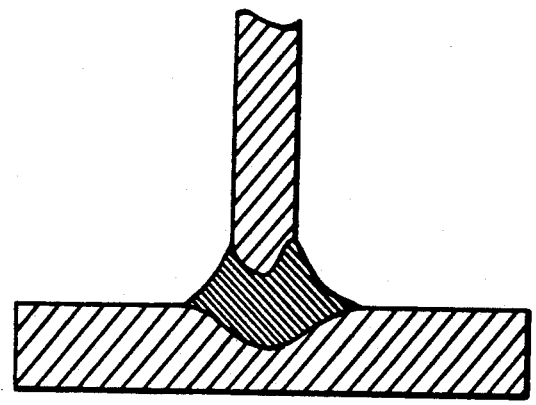
FIG. 4 shows the joining of a thin disk to a round rod with the end faces in a mutually parallel arrangement.

Example 2 was repeated with the modification that a round rod of 5 mm diameter and 80 mm length was joined perpendicularly to a circular plate (20 mm diameter, 5 mm thickness) (cf. FIG. 4). In this case, care was taken to ensure that the heating of the thin disk was less intensive than that of the round rod.

EXAMPLE 5

Example 2 was repeated with the modifications that round rods of 8 m diameter were joined to one another and the heat treatment was carried out by local heat treatment of the joint zone. For this purpose, an electric miniature oven was used which was placed around the round rod in the region of the joint zone and provided with a heat insulation of alumina wool. A laterally introduced thermocouple was used for temperature control (cf. FIG. 5).

We claim:

1. A method for joining two parts of ceramic high-temperature superconductor material of the composition $Bi_{(2+a-b)}(Sr_{1-c}Ca_c)_{(3-a)}Pb_bCu_{(2+d)}O_x$, where a is 0 to 0.3, b is 0 to 0.5, c is 0.1 to 0.9 and d is 0 to 2 and x has a value depending on the state of oxidation of the metals present, said parts having end faces, which comprises heating the end faces of the parts, said end faces being in a parallel arrangement and spaced apart from one another to form a gap between the end faces of the two parts and not being surrounded by a sleeve, by means of a fuel gas/oxygen flame to temperatures from 750° to 875° C. and simultaneously heating a rod of the same material above the gap until a melt thereof drips off into the gap between the end faces of the two parts and completely filling the gap with the resultant formation of a joint region between the two parts, and finally heat-treating at least the joint region for 7 to 100 hours at temperatures between 780° and 850° C.

2. The method as claimed in claim 1, wherein the heat treatment is carried out at temperatures from 815° to 830° C.

3. The method as claimed in claim 1, wherein the heat treatment time depends on the thickness of the joint region and wherein a thicker joint region requires a longer heat treatment time.

4. A method for joining two parts of ceramic high-temperature superconductor material of the composition $Bi_{(2+a-b)}(Sr_{1-c}Ca_c)_{(3-a)}Pb_bCu_{(2+d)}O_x$, where a is 0 to 0.3, b is 0 to 0.5, c is 0.1 to 0.9, and d is 0 to 2 and x has a value depending on the state of oxidation of the metals present, said parts having end faces, which comprises heating the end faces of the parts, said end faces being in a wedge-shaped mutual arrangement and spaced apart from one another to form a gap between the end faces of the two parts and not being surrounded by a sleeve, by means of a fuel gas/oxygen flame to temperatures from 750° to 875° C. and simultaneously hating a rod of the same material above the gap until a melt thereof drips off into the gap between the end faces of the two parts and completely filling the gap with the resultant formation of a joint region between the two parts, and finally heat-treating at least the joint region for 7 to 100 hours at temperatures between 780° to 850° C.

5. The method as claimed in claim 4, wherein the heat treatment is carried out at temperatures from 815° to 830° C.

6. The method as claimed in claim 4, wherein the heat treatment time depends on the thickness of the joint region and wherein a thicker joint region requires a longer heat treatment time.

* * * * *